United States Patent
Higashi et al.

(10) Patent No.: US 7,095,652 B2
(45) Date of Patent: Aug. 22, 2006

(54) SEMICONDUCTOR STORAGE DEVICE

(75) Inventors: Tomoki Higashi, Kanagawa (JP); Takashi Ohsawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 56 days.

(21) Appl. No.: 11/049,727

(22) Filed: Feb. 4, 2005

(65) Prior Publication Data
US 2006/0023540 A1   Feb. 2, 2006

(30) Foreign Application Priority Data
Jul. 28, 2004   (JP)   ............... 2004-219783

(51) Int. Cl.
*G11C 11/34*   (2006.01)
(52) U.S. Cl. .................. 365/185.13; 365/185.21; 365/185.23; 365/201
(58) Field of Classification Search ........... 365/185.13, 365/185.21, 185.23, 201
See application file for complete search history.

(56) References Cited

U.S. PATENT DOCUMENTS

| | | | | |
|---|---|---|---|---|
| 5,157,627 A | * | 10/1992 | Gheewala | 365/189.01 |
| 5,592,425 A | * | 1/1997 | Neduva | 365/201 |
| 5,612,916 A | * | 3/1997 | Neduva | 365/189.04 |
| 6,067,253 A | * | 5/2000 | Gotou | 365/185.25 |
| 6,621,725 B1 | | 9/2003 | Ohsawa | |
| 2005/0265085 A1 | * | 12/2005 | Kuo | 365/189.05 |
| 2006/0062061 A1 | * | 3/2006 | Suh et al. | 365/203 |

FOREIGN PATENT DOCUMENTS
JP   10-241400   9/1998

OTHER PUBLICATIONS
Takashi Ohsawa, et al., "Memory Design Using One-Transistor Gain Cell on SOI", 2002 IEEE ISSCC, Digest of Technical Papers, Feb. 5, 2002, pp. 152-153.

* cited by examiner

*Primary Examiner*—Anh Phung
*Assistant Examiner*—Alexander Sofocleous
(74) *Attorney, Agent, or Firm*—Oblon, Spivak, McClelland, Maier & Neustadt, P.C.

(57) ABSTRACT

A semiconductor storage device comprises memory cells that store data by accumulating or releasing an electric charge; a memory cell array having a matrix arrangement of the memory cells; a plurality of word lines connected to memory cells aligned on rows of the memory cell array; a plurality of sub-bit lines connected to memory cells aligned on columns of the memory cell array; a bit line select circuit selecting the sub-bit line of a column; a main bit line connected to the sub-bit line selected by the bit line select circuit; a sense line detecting the potential of the sub-bit line selected by the bit line select circuit via the main bit line and reading data out of the memory cell; a write driver applying a voltage to the sub-bit line selected by the bit line select circuit via the main bit line and writing data into the memory cell; and a first switching element connected to the main bit line and turning on when the current flowing in the memory cell is detected externally via the sub-bit line without the use of the sense line or when a voltage is applied to the memory cell externally via the sub-bit line without the use of the write driver.

20 Claims, 13 Drawing Sheets

ROW DECODER 20

US 7,095,652 B2

SEMICONDUCTOR STORAGE DEVICE

CROSS-REFERENCE TO RELATED APPLICATION

This application is based upon and claims the benefit of priority from the prior Japanese Patent Applications No. 2004-219783, filed on Jul. 28, 2004, the entire contents of which are incorporated herein by reference.

BACKGROUND OF THE INVENTION

1. Field of the Invention

The present invention relates to a semiconductor storage device.

2. Background Art

FBC (Floating Body Cell) has recently been developed as a densely integrative memory cell in the place of DRAM. FBC memory devices are composed of transistors formed on SOI substrates. FBC memory devices store data "1" or data "0" by accumulating or releasing holes in or from their floating bodies.

Upon testing a conventional FBC memory device, data was written in a memory cell by a write driver prepared for normal operation, and data was read out from the memory cell by a sense amplifier prepared for normal operation.

Therefore, conventional FBC devices had no means to know the characteristics of memory cells themselves. Especially when their write drivers or sense amplifiers did not work well, it was impossible to evaluate memory cells themselves (T. Ohsawa et al., "Memory Design Using One-Transistor Gain Cell on SOI", IEEE ISSCC (International Solid-State Circuits Conference), February 2002, Digest of Technical Papers, pp 152–153).

Taking it into consideration, here is provided a semiconductor storage device capable of evaluating the characteristics of its memory cells themselves externally without using a write driver or a sense amplifier.

SUMMARY OF THE INVENTION

A semiconductor storage device according to an embodiment of the present invention comprises memory cells that store data by accumulating or releasing an electric charge; a memory cell array having a matrix arrangement of the memory cells; a plurality of word lines connected to memory cells aligned on rows of the memory cell array; a plurality of sub-bit lines connected to memory cells aligned on columns of the memory cell array; a bit line select circuit selecting the sub-bit line of a column; a main bit line connected to the sub-bit line selected by the bit line select circuit; a sense line detecting the potential of the sub-bit line selected by the bit line select circuit via the main bit line and reading data out of the memory cell; a write driver applying a voltage to the sub-bit line selected by the bit line select circuit via the main bit line and writing data into the memory cell; and a first switching element connected to the main bit line and turning on when the current flowing in the memory cell is detected externally via the sub-bit line without the use of the sense line or when a voltage is applied to the memory cell externally via the sub-bit line without the use of the write driver.

A semiconductor storage device according to an embodiment of the present invention comprises memory cells that store data by accumulating or releasing an electric charge; a memory cell array having a matrix arrangement of the memory cells; a plurality of word lines connected to memory cells aligned on rows of the memory cell array; a plurality of sub-bit lines connected to memory cells aligned on columns of the memory cell array; a first bit line select circuit selecting the sub-bit line of a column of the memory cell array during a normal operation of the semiconductor storage device; a main bit line connected to the sub-bit line selected by the first bit line select circuit; a sense line detecting the potential of the sub-bit line selected by the first bit line select circuit via the main bit line and reading data out of the memory cell; a write driver applying a voltage to the sub-bit line selected by the first bit line select circuit via the main bit line and writing data into the memory cell; a second bit line select circuit selecting the sub-bit line of a column of the memory cell array during a test operation of the semiconductor storage device; and a first switching element connected to the second bit line select circuit and turning on when the potential on the sub-bit line is detected externally without the use of the sense line or when a voltage is applied to the sub-bit line externally without the use of the write driver.

DETAILED DESCRIPTION OF THE INVENTION

Explained below are embodiments of the present invention with reference to the drawings. The embodiments, however, should not be construed to limit the present invention.

(First Embodiment)

Figure 1:
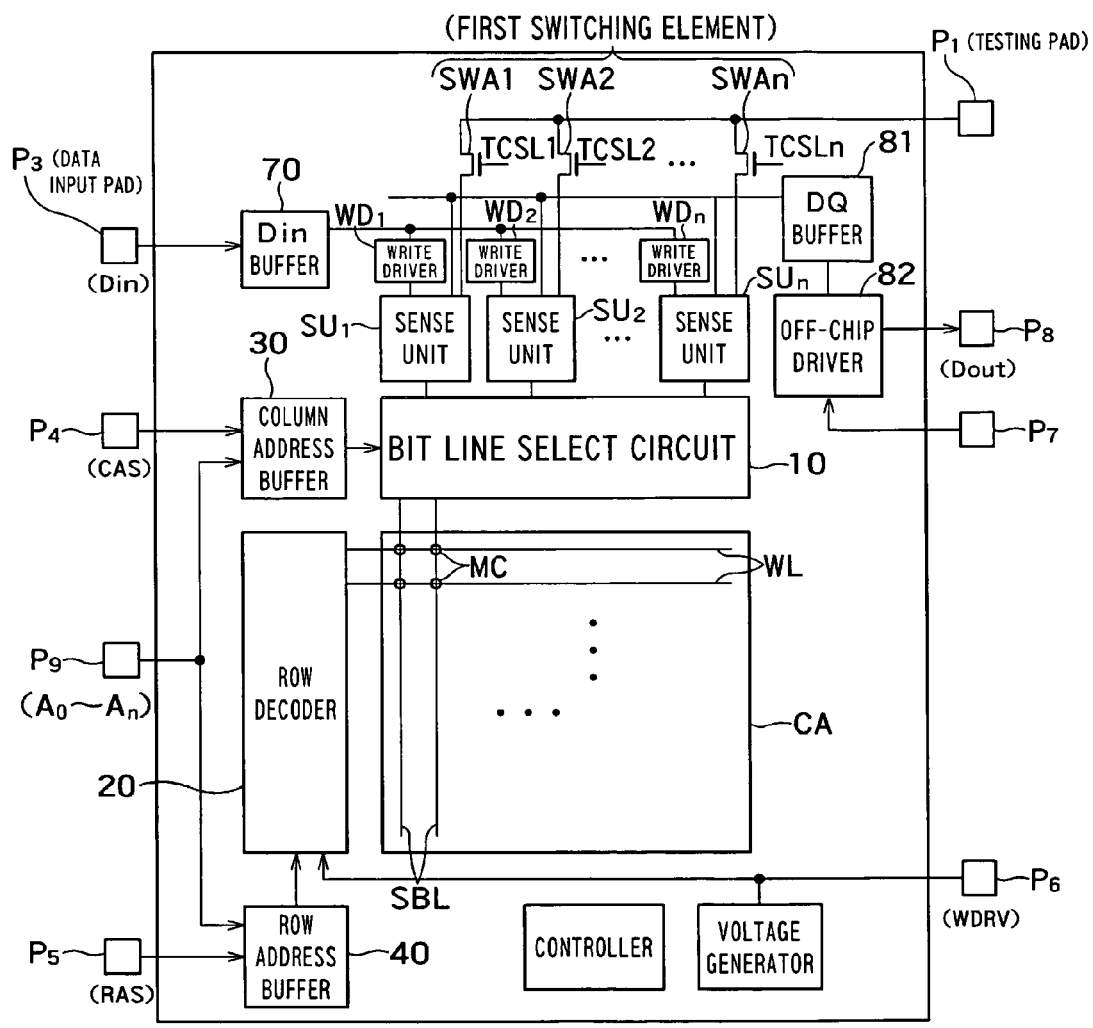
FIG. 1 is a block diagram of a semiconductor storage device 100 according to the first embodiment of the invention.

FIG. 1 is a block diagram of a semiconductor storage device 100 according to the first embodiment of the invention. The semiconductor storage device 100 comprises memory cells MC, a memory cell array CA, word lines WL, sub-bit lines SBL, a bit line select circuit 10, a row decoder 20, a column address buffer 30, a row address buffer 40, sense units SU1~SUn, write drivers WD1~WDn, a Din buffer 70, a DQ buffer 81, an off-chip driver 82, pads P1~P8, and switching elements SWA1~SWAn.

The semiconductor storage device 100 can be, for example, a FBC memory device or a DRAM. Memory cells store data by accumulating or releasing electric charges. The memory cells may be, for example, FBC memory cells or DRAM cells. The memory cell array CA includes a plurality of memory cells MC in a matrix arrangement. Each word line WL is connected to memory cells MC on individual rows of the memory cell array CA. Each sub-bit line SBL is connected to memory cells MC on individual columns of the memory cell array CA.

The bit line select circuit 10 selects the sub-bit line SBL of any arbitrary column in accordance with a column address signal CAS and an address signal A0~An from the column address buffer 30, and connects the sub-bit line SBL to a sense unit of SU1~SUn. The row decoder 20 selects the word line WL of any arbitrary row in accordance with row address signal RAS and the address signal A0~An from the row address buffer 40, and activates the word line WL selected.

The sense units SU1~SUn are connected to the bit line select circuit 10. The write drivers WD1~WDn are individually connected to associated ones of the sense units SU1~SUn. The Din buffer 70 is connected to the write drives WD1~WDn. The switching elements SWA1~SWAn are individually connected to associated ones of the sense units SU1~SUn. The switching elements SWA1~SWAn may be MOSFETs, for example. In this case, the switching elements SWA1~SWAn may be either N-type MOS or P-type MOS. Alternatively, the switching elements SWA1~SWAn may be parallel connections of N-type MOS and P-type MOS.

Figure 2:
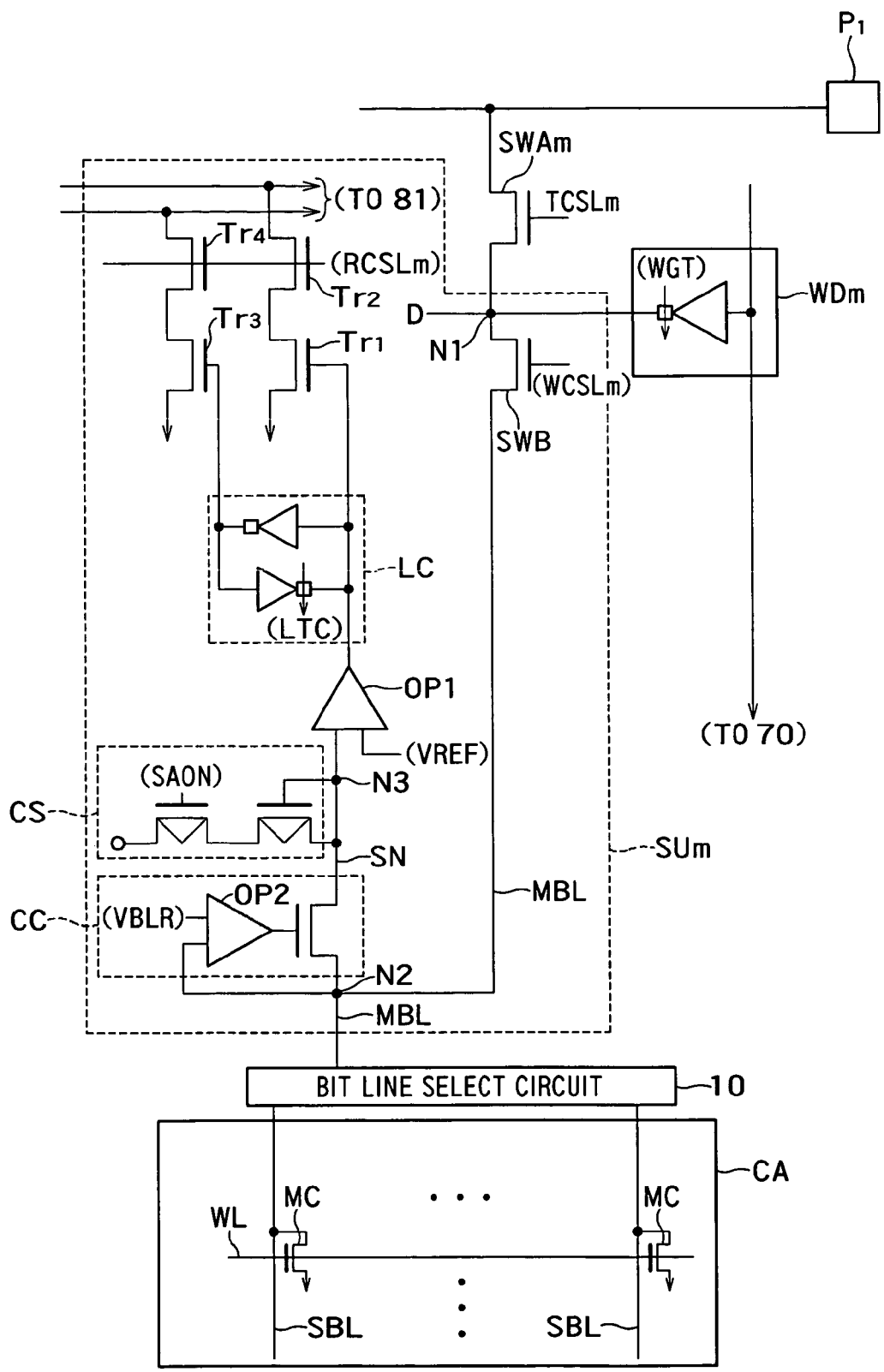
FIG. 2 is a diagram showing the relationship among a sense unit SUm, write driver WDm and switching element SWAm in greater detail.

FIG. 2 is a diagram showing the relationship among a sense unit SUm, write driver WDm and switching element SWAm in greater detail. Note here that $1 \leq m \leq n$. The sense unit SUm includes a main bit line MBL extending from the bit line select circuit 10. The main bit line MBL is in serial connection with a switching element SWB. The write driver WDm is connected to the main bit line MBL via the switching element SWB. The write driver WDm can take the ENABLE state or the DISABLE state depending upon a WGT signal. In the ENABLE state, the write driver WDm inverts the input signal Din and passes it to the main bit line MBL. In the DISABLE state, the write driver WDm dose not permit the input signal Din to pass through. The DISABLE state pertains to render the output of the write driver WDm floating.

The switching element SWAm has one end connected to the node N1 between the switching element SWB and the output of the write driver WDm, and the other end connected to the pad P1. That is, the switching element SWAm is interposed between the pad P1 and the main bit line MBL.

A sense line SN extends from the node N2 between the switching element SWB and the bit line select circuit 10. The sense line SN is a data detector connecting a clamp circuit CC, a current source CS and an operational amplifier OP1. One end of the clamp circuit CC is connected to the main bit line MBL at the node N2. The other end of the clamp circuit CC is connected to one of inputs of the operational amplifier OP1 via the sense line SN. The other input of the operational amplifier OP1 is connected to the reference potential VREF used to identify data in memory cells MC.

Output data of the operational amplifier OP1 is delivered to the DQ buffer 81 (see FIG. 1) via transistors Tr1~Tr4. The DQ buffer 81 outputs this output data from the pad P8 through the off-chip driver 82. Output of the operational amplifier OP1 is in connection with a latch circuit LC.

Next explained is how the first embodiment operates.

(Write Operation Under Normal Use: Normal Write Mode)

A write operation during normal use is executed by the write driver WDm.

First, the row decoder 20 selects a word line WL, and activates the word line WL to a high level (for example, 1.5 V). The word lines WL not selected maintain a low level (for example, −1.5 V) like that during storage of data. Then, the bit select circuit 10 selects one of sub-bit lines SBL in the memory cell array CA, and connects the sub-bit line SBL selected to the main bit line MBL.

The bit line select circuit 10 next selects the sub-bit line SBL, and connects it to the main bit line MBL. Thereafter, a write column selection signal WCSLm is selected. At this time, the test column selection signal TCSLm is not selected. As a result, the switching element SWAm remains off whereas the switching element SWB turns on. The write driver WDm is in the ENABLE state, and permits the input signal Din to pass in the inverted form.

The input signal Din from the data input pad P3 shown in FIG. 1 is input to the write driver WDm via the Din buffer 70. At this time, since the switching element SWB is on, and the switching element SWAm is off, the input signal Din is delivered to the sub-bit line SBL selected by the bit line select circuit 10 via the main bit line MBL. As a result, data based on the input signal Din is stored in the memory cell MC.

(Write Operation Under Test of the Memory Cell MC: Test Write Mode)

Write operation in the test of the memory cell MC is executed by directly applying a voltage to the pad P1 externally without using the write driver WDm.

First, the row decoder 20 selects a word line WL and activates it to the HIGH level (for example, 1.5 V). Non-selected word lines WL maintain the LOW level (for example, −1.5 V) like that during storage of data).

The bit line select circuit 10 next selects a sub-bit line SBL, and connects it to the main bit line MBL. Thereafter, a write column select signal WCSLm and a test column select signal TCSLm are selected. As a result, since the switching elements SWAm and SWAm turn on, the pad P1 is connected to the main bit line MBL via the switching elements SWAm and SWBm. At this time, the write driver WDm is in the DISABLE state, and does not permit the input signal Din to pass. Therefore, a desired voltage can be applied to the memory cell MC externally via the main bit line MBL and the sub-bit line SBL. For example, when data "1" should be written, the HIGH level (for example, 1.5 V)

may be applied to the pad P1. When data "0" should be written, the LOW level (for example, −1.5 V) may be applied to the pad P1.

After that, the word line WL selected is returned to the LOW level (for example, −1.5 V). In addition, the switching elements SWAm and SWBm are turned off, and the voltage of the pad P1 is changed to 0 V.

As such, the first embodiment can apply a desired voltage directly to the memory cell MC not via the write driver WDm and the Din buffer 70. As a result, it can be judged whether the memory cell MC can normally store data or not.

(Read Operation Under Normal Use: Normal Read Mode)

Read operation under normal use is executed with the use of the operational amplifier OP1, or the like, connected to the sense line SN.

First, the row decoder 20 selects a word line WL and activates it to the HIGH level (for example, 1.5 V). Non-selected word lines remain at the LOW level (for example, −1.5 V) like that during storage of data.

The bit line select circuit 10 next selects a sub-bit line SBL and connects it to the main bit line MBL.

After that, the voltage VBLR input to the operational amplifier OP2 is set to 0.2 V, for example. Thereby, the clamp circuit CC controls the voltage of the node N2 to a constant value, such as 0.2 V. The voltage of the node N2 is a voltage value activating the memory cell MC in a tripodic state to prevent breakage of data in the memory cell MC by the read operation.

During the read operation, the signal SAON of the current source CS is LOW. Therefore, the current source CS supplies a current to the memory cell MC through the sense line SN, the main bit line MBL and the sub-bit line SBL. At this time, in case the data of the selected memory cell MC is "0", the threshold voltage of the memory cell MC is relatively high, and the current flowing into the memory cell MC (hereafter called the cell current) is relatively small. On the other hand, in case the data of the selected memory cell MC is "1", the threshold voltage of the memory cell MC is relatively low, the cell current is relatively large. In other words, the potential of the node N3 is higher under data "0" than under data "1". The reference voltage VREF is set to an intermediate voltage higher than the potential of the node N3 under data "1" and lower than the potential of the node N3 under data "0".

The operational amplifier OP1 compares the potential of the node N3 with the reference potential VREF, and it outputs the LOW level under data "1" and the HIGH level under data "0". That is, the operational amplifier OP1 outputs a signal inverted in polarity from the data of the memory cell MC selected. This output data is stored in the latch circuit LC.

Further, the read column select signal RCSLm becomes the HIGH level, and the transistors Tr2 and Tr4 turn on. When the output of the operational amplifier OP1 is the LOW level (data "1"), the transistors Tr1 and Tr3 are off. Therefore, a HIGH level signal is transferred to the DQ buffer 81. When the output of the operational amplifier OP1 is the HIGH level (data "0"), a LOW level signal is transferred to the DQ buffer 81. That is, the output data is inverted again via the transistors Tr1~Tr4 to transfer the data "1" as the HIGH level and the data "0" as the LOW level to the DQ buffer 81.

(Read Operation During Test: Test Read Mode)

Read operation during test of the memory cell MC is executed by applying a voltage to the pad P1 directly from outside and thereby measuring the current flowing into the memory cell MC from the pad P1 without using the sense line SN.

First, the row decoder 20 selects a word line WL and activates it to the HIGH level (for example, 1.5 V). Non-selected word lines WL maintain the LOW level (for example, −1.5 V).

The bit line select circuit 10 next selects a sub-bit line SBL and connects it to the main bit line MBL.

Next, the write column select signal WCSLm and the test column select signal TCSLm beome the HIGH level, and the test pad P1 is connected to the main bit line MBL. At this time, the write driver WDm is in the DISABLE state. The signal SAON input into the current source CS is the HIGH level, and the current source CS does not supply a current to the sense line SN.

Next, a voltage (such as 0.2 V) of a level activating the memory cell MC in a tripodic state is applied to the memory cell MC externally via the test pad P1. At this time, the current value flowing into the memory cell MC from the test pad P1 is measured.

Figure 3:
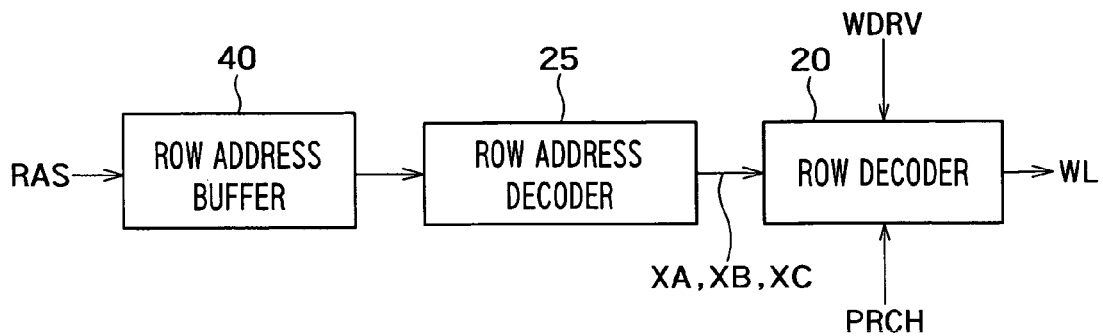
FIG. 3 is a block diagram showing a row address buffer 40, row decoder 20 and a row address decoder 25 interposed between them.

FIG. 3 is a block diagram showing a row address buffer 40, rod decoder 20 and a row address decoder 25 interposed between them. A row address signal RAS is input from the pad P5 shown in FIG. 1. The row address decoder 25 receives the row address signal RAS and address signals A0~An through the row address buffer 40. The row address decoder 25 pre-decodes the row address signal RAS and the address signals A0~An, and outputs signals XA, XB and XC. The row decoder 20 receives the signals XA, XB, XC, a pre-charge signal PRCH and a word lie drive signal WDRV. The word line drive signal WDRV is the voltage to be applied to the word line WL selected, which is supplied from the pad P6 shown in FIG. 1.

Figure 4:
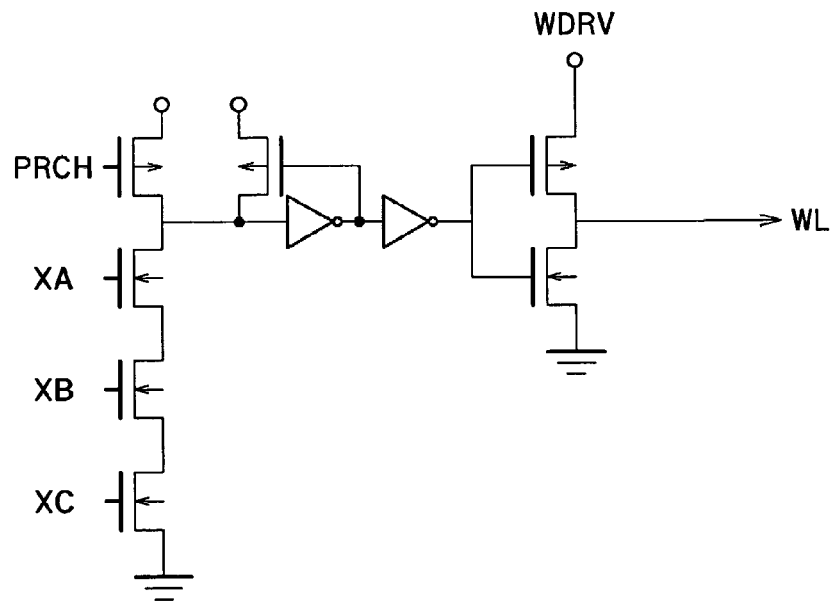
FIG. 4 is a circuit diagram showing configuration of the row decoder 20.

FIG. 4 is a circuit diagram showing configuration of the row decoder 20. The row decoder 20 activates the word line WL when the pre-charge signal PRCH is the HIGH level and all of the signals XA, XB and XB exhibit the HIGH level. At this time, the word line drive signal WDRV can be controlled via the pad P6. As a result, the voltage value of the word line WL can be changed as desired.

Thereby, the voltage level of the word line WL is swept while a voltage is applied externally via the test pad P1. At this time, the current value flowing into the memory cell MC from the test pad P1 can be measured without the use of the sense unit SUm. Therefore, this embodiment can accurately obtain the current-to-voltage characteristics of the memory cell MC.

According to the first embodiment, it is possible to apply a voltage to the memory cell MC directly from outside upon writing data without using the write driver WDm. Therefore, even when the write driver WDm is defective, data can be written in the memory cell MC. Further, the first embodiment can write data of a desired voltage value upon writing data in the memory cell MC.

According to the embodiment, it is possible to apply a voltage to the pad P1 directly from outside upon reading data without the use of the sense unit. Further, the current flowing into the memory cell MC from the pad P1 can be measured without the use of the sense line SN. As a result, since the cell current can be detected directly, characteristics of the memory cell MC (threshold voltage, current-to-voltage characteristics, and so on) can be measured accurately.

As such, the first embodiment enables testing of the memory cell MC itself. The capability of judging whether the memory cell MC is good or not means the capability of judging whether the write driver WDm and the sense unit SU are good or not as well. That is, the first embodiment enables testing the operations of the write driver WDm and the sense unit SU.

For example, after data is written in the memory cell MC in the test write mode, the sense unit SUm can be tested by reading data with the use of the sense unit SUm in the normal read mode. After data is written in the memory cell MC in the normal write mode with the use of the write driver WDm, the write driver WDm can be tested by reading data in the test read mode.

Although the drawings of the first embodiment show only one memory cell array CA, the first embodiment may include more memory cell arrays CA. In this case, a plurality of sense units SUm may be provided in association with individual memory cell arrays CA. Each of the sense unit SUm and the bit line select circuit 10 may be provided one for a plurality of sub-bit lines SBL. In this case, the bit line select circuit selects one of the plurality sub-bit lines SBL and connects it to the sense unit SUm.

(Second Embodiment)

Figure 5:
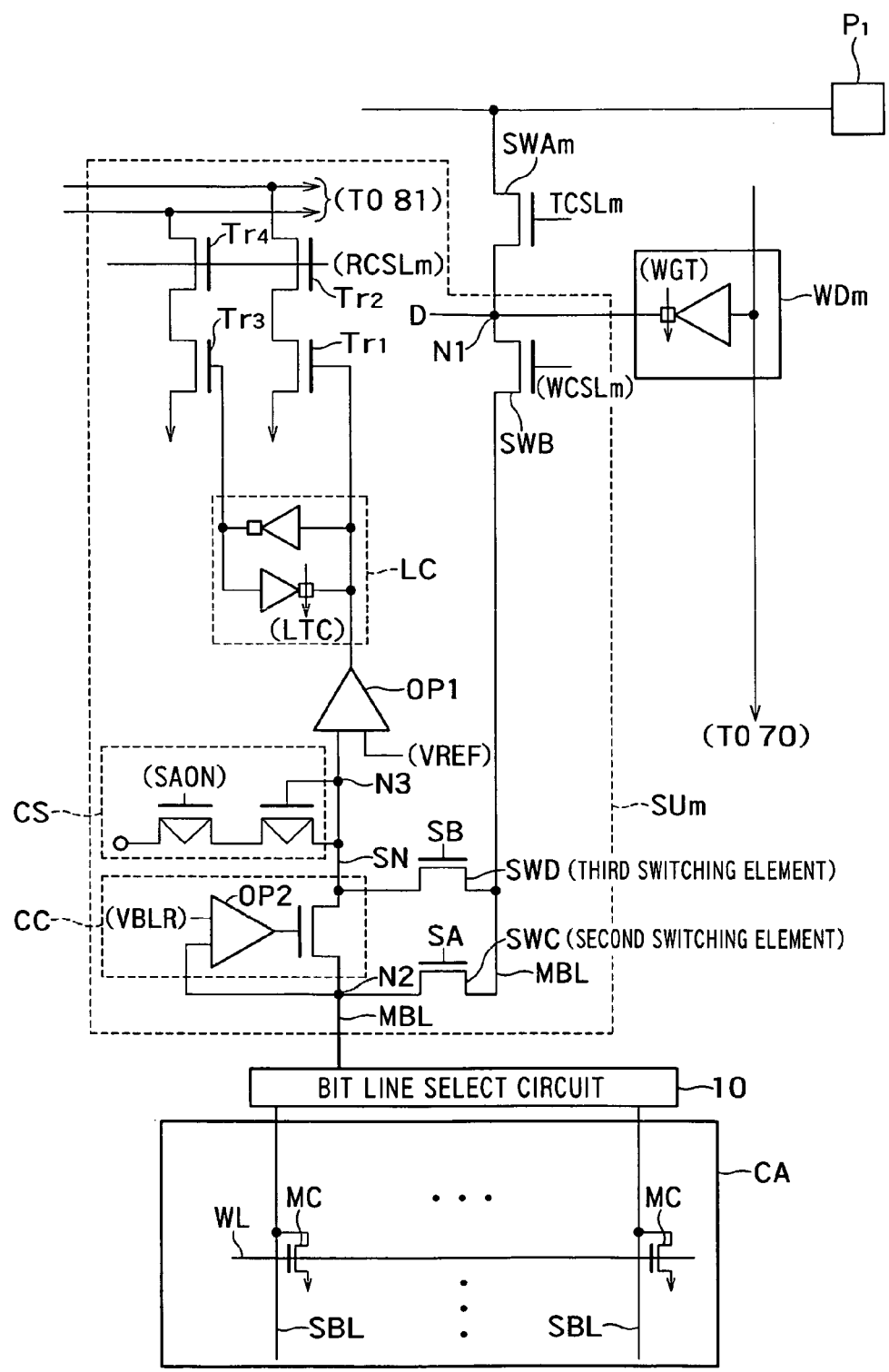
FIG. 5 is a circuit diagram showing a semiconductor storage device 200 according to the second embodiment of the invention.

FIG. 5 is a circuit diagram showing a semiconductor storage device 200 according to the second embodiment of the invention. The second embodiment is different from the first embodiment in including witching elements SWC and SWD. The other components of the second embodiment may be identical to the components of the first embodiment.

The switching element SWC as the second switching element is interposed in the main bit line MBL from the write drive WDm to the bit line select circuit 10. The switching element SWC can switch between the switching element SWB and the node N2.

The switching element SWD as the third switching element has one end connected between the clamp circuit CC and the operational amplifier OP1 and the other end connected to the main bit line MBL from the driver WDm to the switching element SWC. The switching elements SWC and SWD may be MOSFETs, for example.

Operations of the second embodiment will be explained below.

(Normal Write Mode)

In the normal write mode, the switching element SWC is on, and the switching element SWD is off. In this status, the device executes the same operations as those of the normal write mode in the first embodiment.

(Test Write Mode)

In the test write mode, the switching element SWC is on, and the switching element SWD is off. In this status, the device executed the same operations as those of the test write mode in the first embodiment.

(Normal Read Mode)

In the normal read mode, the switching elements SWC and SWC are off. In this status, the device executed the same operations as those of the normal read mode in the first embodiment.

(Test Read Mode)

The test read mode of the second embodiment is different from that of the first embodiment in that the clamp circuit CC can apply a constant voltage to the memory cells MC.

Like the test read mode of the first embodiment, a word line WL and a sub-bit line SBL are first selected.

Next, the write column select signal WCSLm and the test column select signal TCSLm become the HIGH level, and the test pad P1 is connected to the main bit line MBL. At this time, the write driver WDm is in the DISABLE state. The signal SAON inputted to the current source CS is in the HIGH level, and the current source CS does not supply a current to the sense line SN.

The device further turns the switching element SWC off and the switching element SWD on. The test pad P1 is supplied with a voltage not lower than the level capable of actuating the memory cell MC in the tripodic state. On the other hand, the clamp circuit CC applies a voltage of a level capable of activating the memory cell MC in the tripodic state (for example, 0.2 V). In this status, the device measures the current value flowing into the memory cell MC from the test pad P1.

The second embodiment shows the same effects as those of the first embodiment. In addition, since the second embodiment uses the clamp circuit CC, it is not affected by the voltage drop caused by the wiring resistance of the main bit line MBL from the test pad P1 to the bit line select circuit 10 and by the resistance of the switching elements TCSLm, WCSLm and SWC. Therefore, the second embodiment enables more accurate measurement of the characteristics of the memory cell MC.

(Third Embodiment)

Figure 6:
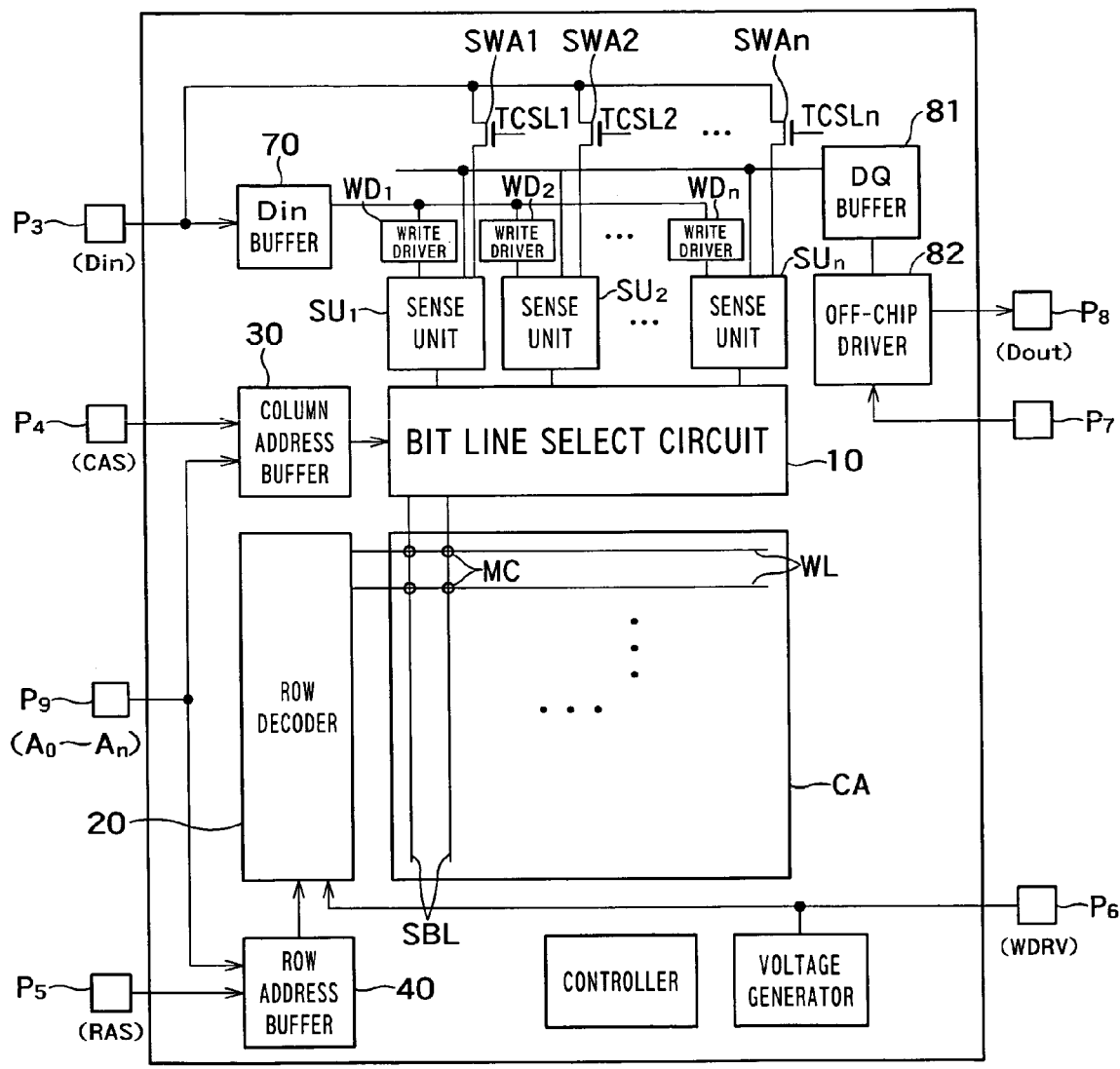
FIG. 6 is a block diagram of a semiconductor storage device 300 according to the third embodiment of the invention.

FIG. 6 is a block diagram of a semiconductor storage device 300 according to the third embodiment of the invention. The third embodiment is different from the first embodiment in commonly using the data input pad P3 as the test pad as well. The other components of the third embodiment are identical to those of the first embodiment.

Figure 7:
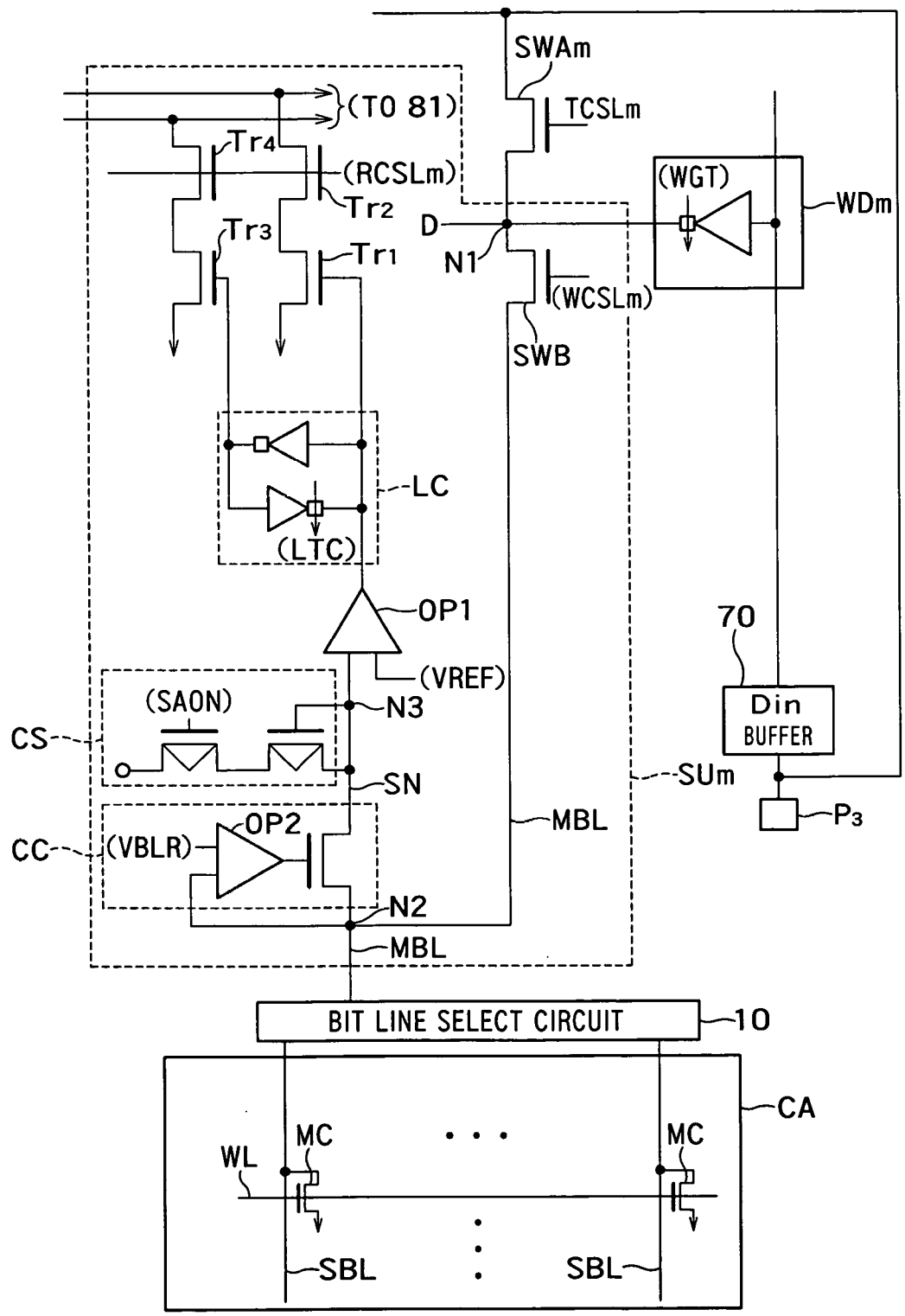
FIG. 7 is a diagram showing the relationship among a sense unit SUm, the write driver WDm and the switching element SWAm in greater detail.

FIG. 7 is a diagram showing the relationship among the sense units Sum, the write driver WDm and the switching element SWAm in greater detail.

In the third embodiment, one end of the switching element SWAm is connected to the output of the write driver WDm, and the other end thereof is connected to the data input pad P3. That is, the switching element SWAm is connected between the data input pad P3 and the node N1 to bypass the Din buffer 70 and the write driver WDm.

In the test write mode and the test read mode of the third embodiment, a voltage is applied externally through the data input pad P3, and the cell current is measured through the data input pad P3. The other behaviors of the third embodiment, which are not explained here, are identical to those of the first embodiment.

The third embodiment shows the same effects as those of the first embodiment. In addition, since the third embodiment uses the existing pad for testing as well, it does not need any additional pad for testing. As a result, the third embodiment can restrict the increase of the chip area of the semiconductor storage device.

(Fourth Embodiment)

Figure 8:
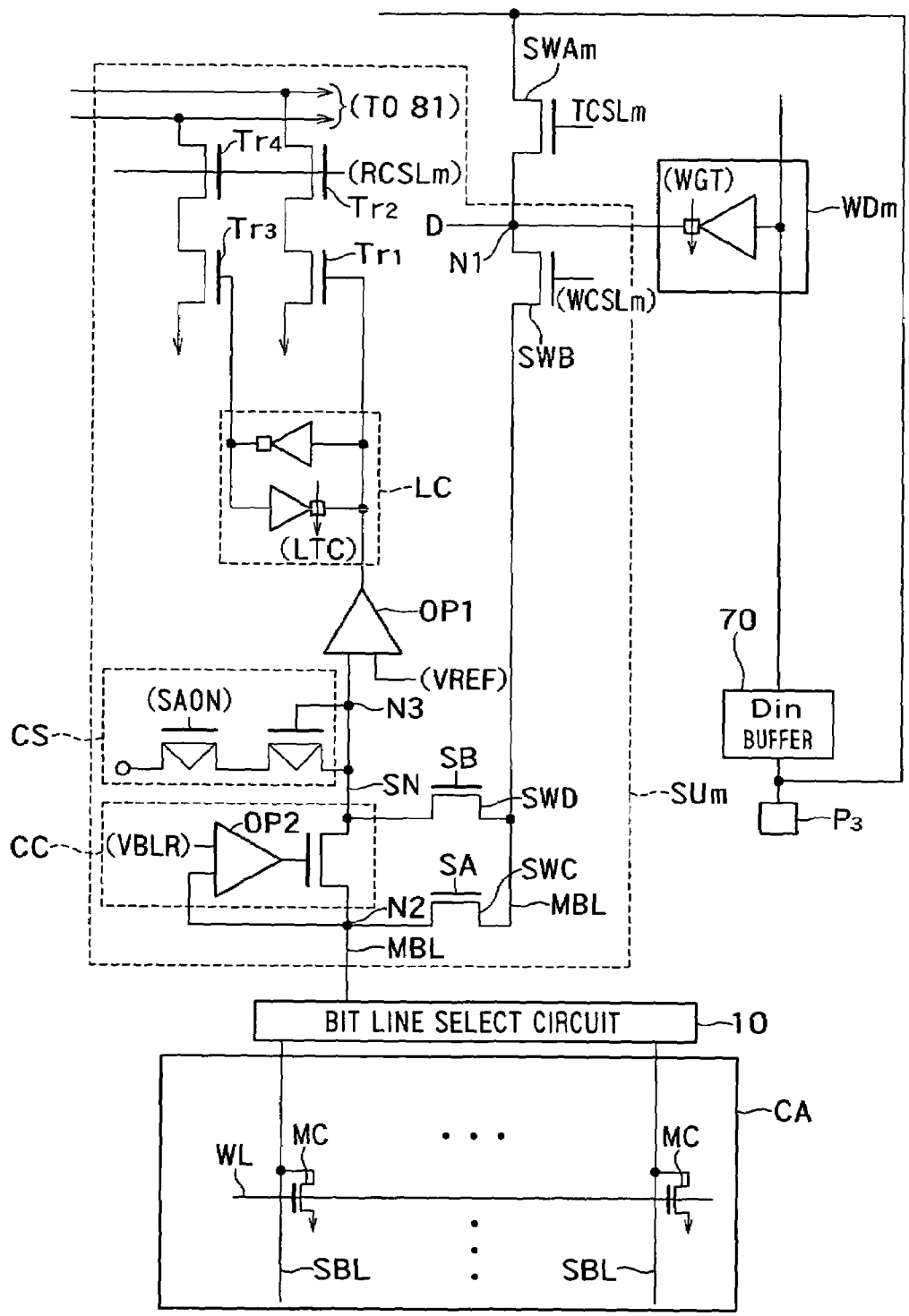
FIG. 8 is a circuit diagram of a semiconductor storage device 400 according to the fourth embodiment of the invention.

FIG. 8 is a circuit diagram of a semiconductor storage device 400 according to the fourth embodiment of the invention. The fourth embodiment is different from the third embodiment in the use of the switching elements SWC and SWD. The other components of the fourth embodiment are identical to those of the third embodiment. Therefore, the relation between the fourth and the third embodiment corresponds to the relation between the second embodiment and the first embodiment.

The switching element SWC as the second switching element is interposed in the main bit line MBL from the write driver WDm to the bit line select circuit 10. The switching element SWC can switch between the switching element SWB and the node N2.

The switching element SWD as the third switching element has one end connected between the clamp circuit CC and the operational amplifier OP1 and the other end connected to the main bit line MBL from the write driver WDm to the switching element SWC.

In the test write mode and the test read mode, a voltage is applied externally via the data input pad P3, and the cell current is measured via the data input pad P3. The other behaviors of the fourth embodiment, which are not explained here, are identical to those of the second embodiment.

The fourth embodiment shows both the effects of the second embodiment and those of the third embodiment.

(Fifth Embodiment)

Figure 9:
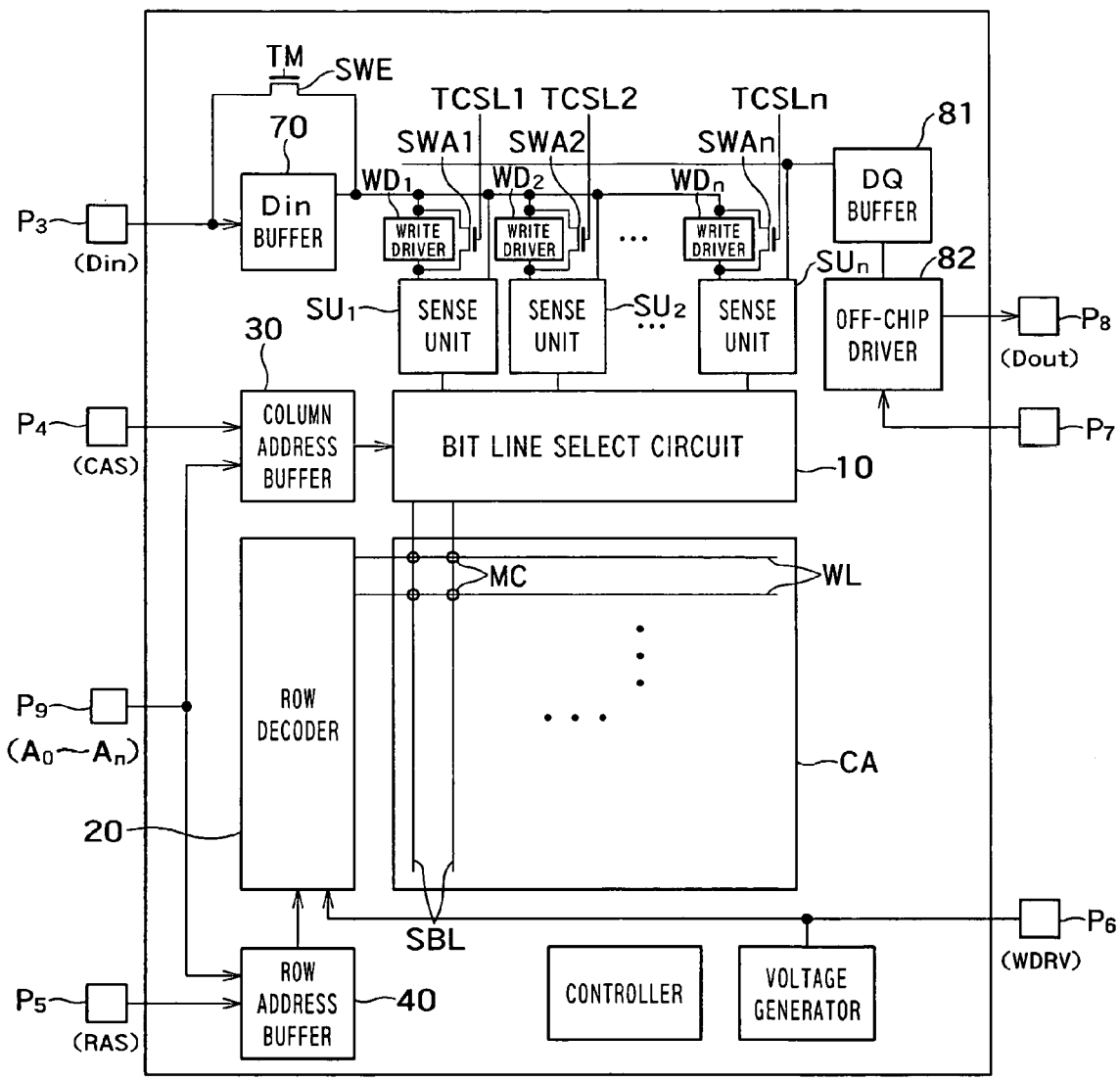
FIG. 9 is a block diagram of a semiconductor storage device 500 according to the fifth embodiment of the invention.

FIG. 9 is a block diagram of a semiconductor storage device 500 according to the fifth embodiment of the invention. The fifth embodiment is different from the third embodiment in including an additional switching element SWE and using the wiring from the Din buffer 70 to the write driver WDm for testing. The other components of the fifth embodiment are identical to those of the third embodiment.

Figure 10:
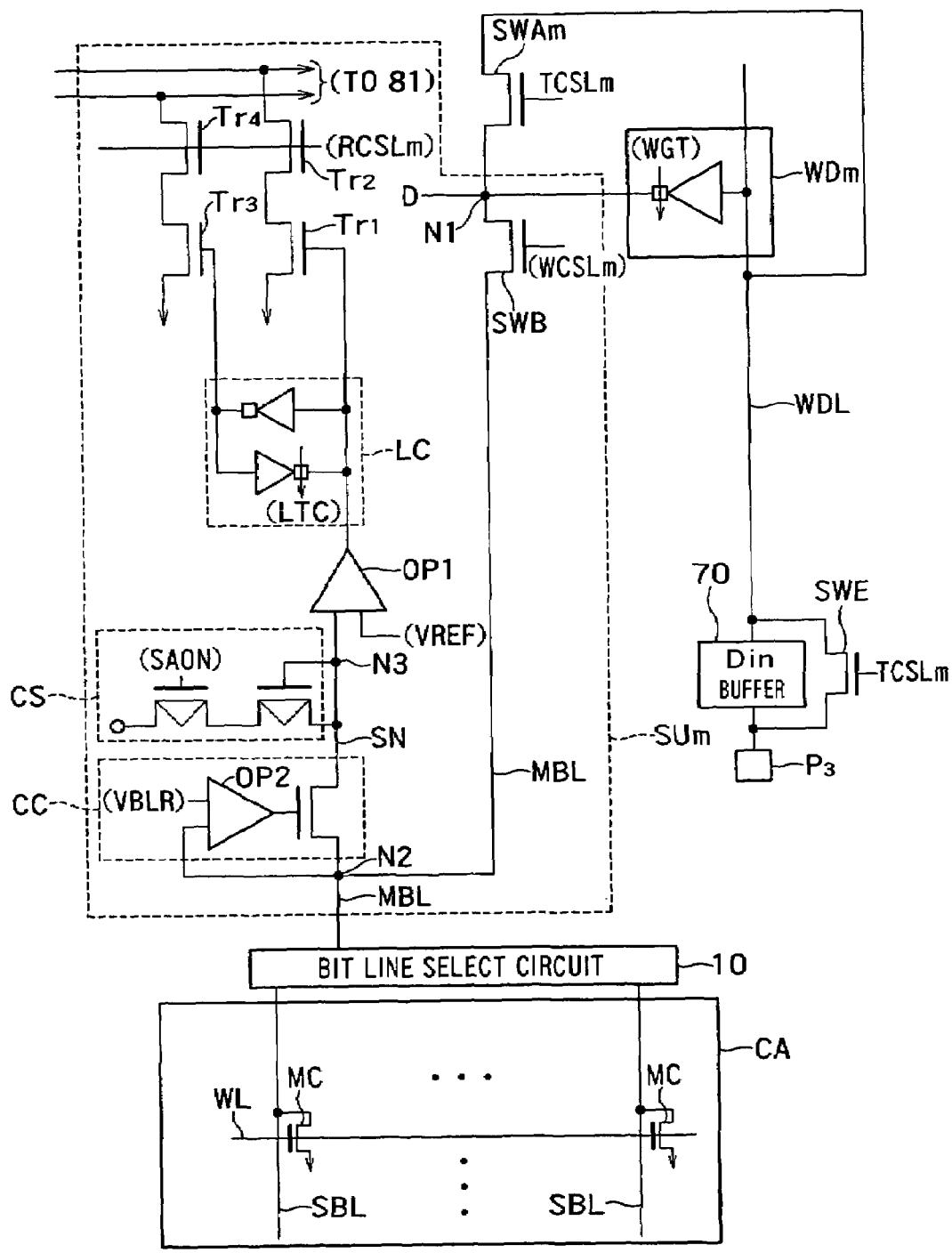
FIG. 10 is a diagram showing the relationship among a sense unit SUm, the write driver WDm and the switching element SWAm in greater detail.

FIG. 10 is a diagram showing the relationship among the sense units SUm, the write driver WDm and the switching element SWAm in greater detail.

In the fifth embodiment, the switching element SWE is connected in parallel to the Din buffer 70. The switching element SWE may be a MOSFET, for example. One end of the switching element SWAm is connected to the write data line WDL near the write driver WDm, and the other end thereof is connected to the node N1. Therefore, the upon testing the semiconductor storage device 500, the switching element SWE can bypass the Din buffer 70, and the switching element SWAm can bypass the write driver WDm.

In the test write mode and the test read mode, the switching elements SWE and SWAm are on. In the normal write mode and the normal read mode, the switching elements SWE and SWAm are off. The other behaviors of the fifth embodiment, which are not explained here, are identical to those of the third embodiment.

The fifth embodiment can attain the same effects as those of the third embodiment. In addition, since the fifth embodiment uses the write data line WDL for testing as well, it does not need the additional wiring from the data input pad P3 to the switching element SWAm. Since the write data line WDL is significantly long in the actual circuit, the fifth embodiment can restrict the increase of the chip area of the semiconductor storage device more.

(Sixth Embodiment)

Figure 11:
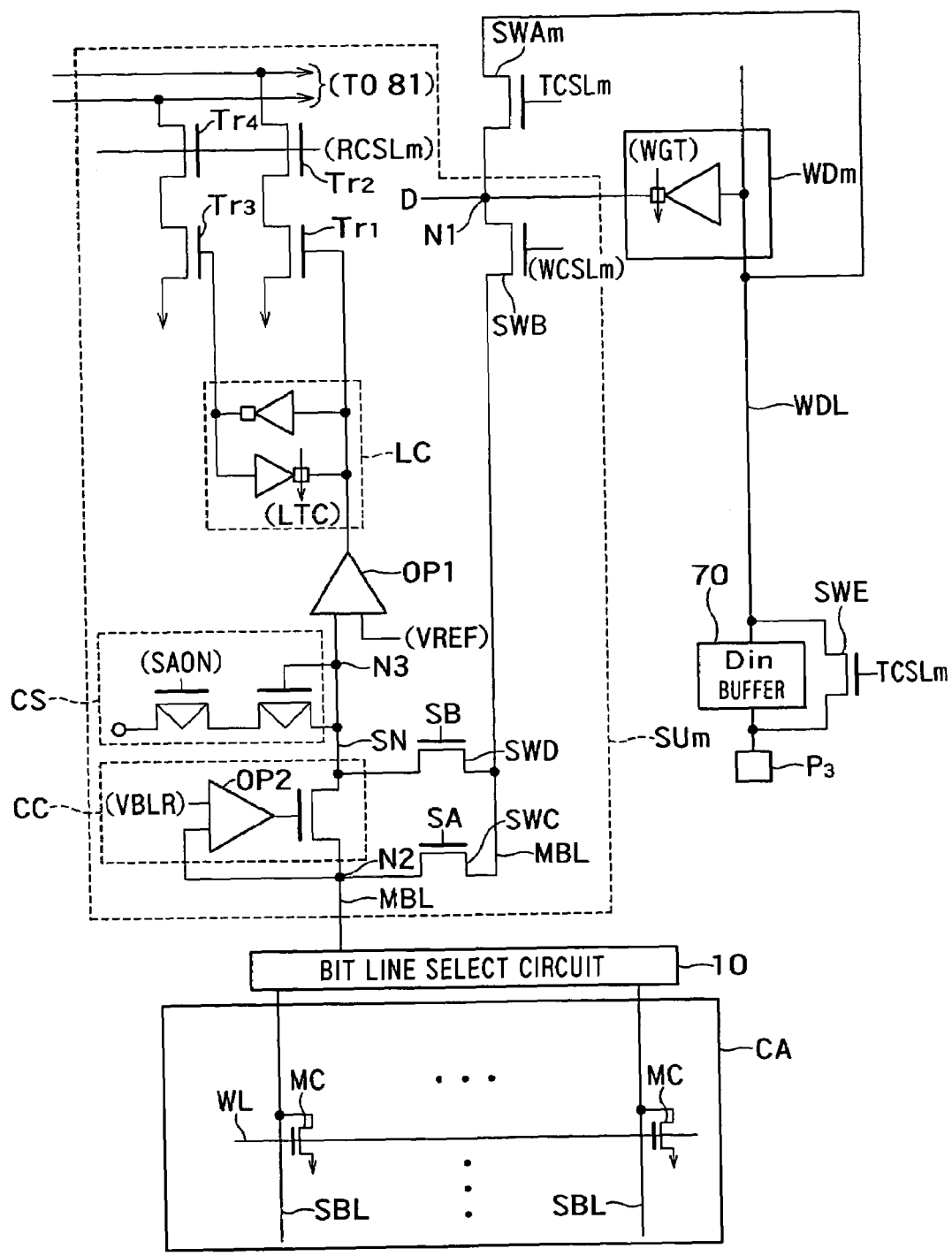
FIG. 11 is a circuit diagram of a semiconductor storage device 600 according to the sixth embodiment of the invention.

FIG. 11 is a circuit diagram of a semiconductor storage device 600 according to the sixth embodiment of the invention. The sixth embodiment is different from the fifth embodiment in the use of the switching elements SWC and SWD. The other components of the sixth embodiment are identical to those of the fifth embodiment. Therefore, the relation between the sixth embodiment and the fifth embodiment corresponds to the relation between the second embodiment and the first embodiment.

The switching element SWC is interposed in the main bit line MBL from the write driver WDm to the bit line select circuit 10. The switching element SWC can switch between the switching element SWB and the node N2.

One end of the switching element SWD is connected between the clamp circuit CC and the operational amplifier OP1, and the other end thereof is connected to the main bit line MBL from the write driver WDm to the switching element SWC.

In the test write mode and the test read mode, the switching elements SWE and SWAm are on. In the normal write mode and the normal read mode, the switching elements SWE and SWAm are off. The other behaviors of the sixth embodiment, which are not explained here, are identical to those of the fourth embodiment.

The sixth embodiment shows both the effects of the fourth embodiment and the effects of the fifth embodiment.

(Seventh Embodiment)

Figure 12:
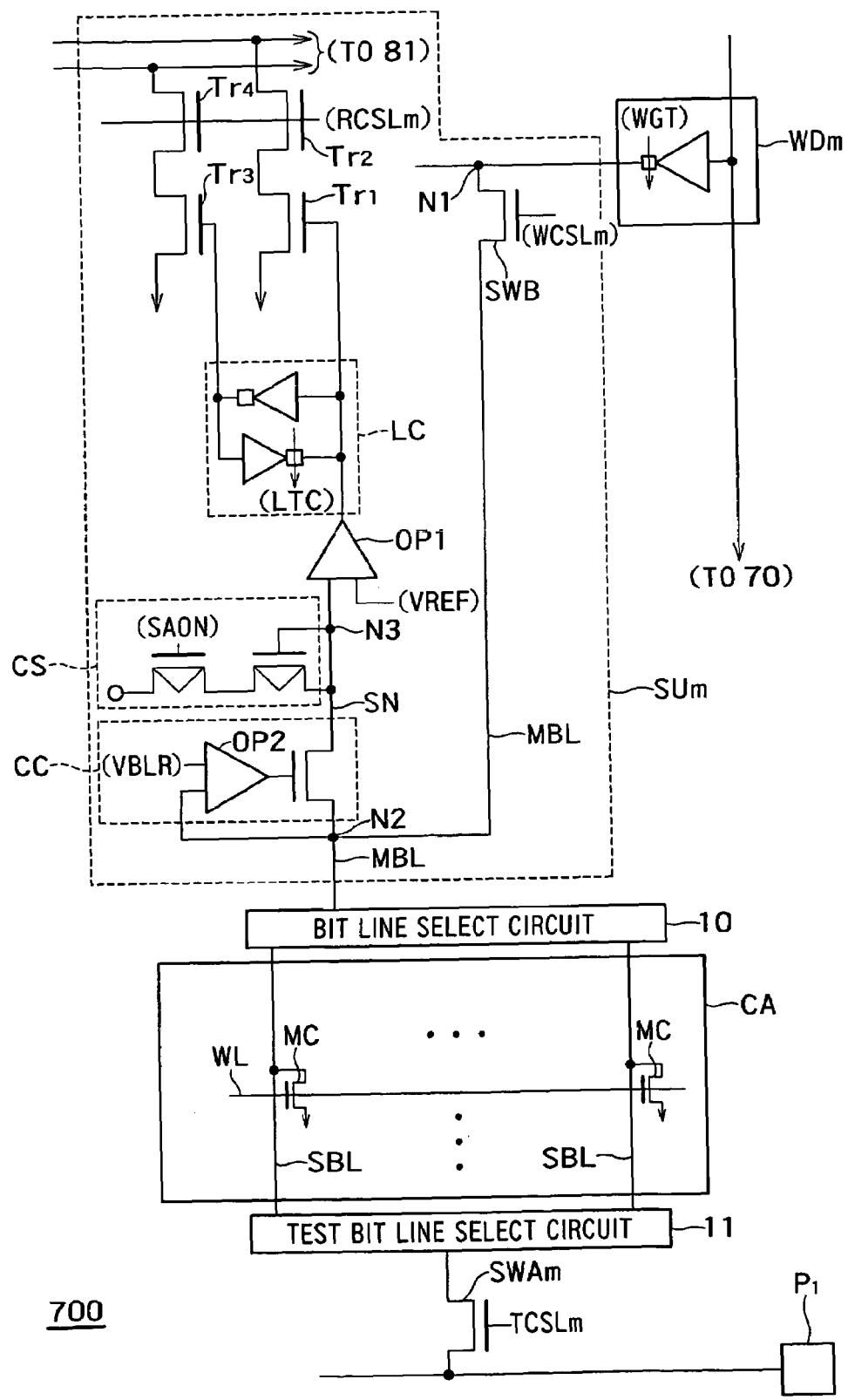
FIG. 12 is a circuit diagram of a semiconductor storage device 700 according to the seventh embodiment of the invention.

FIG. 12 is a circuit diagram of a semiconductor storage device 700 according to the seventh embodiment of the invention. The seventh embodiment is different from the first embodiment in including a test bit line select circuit (t-BL select circuit) 11 and connecting the switching element SWAm between the t-BL select circuit 11 and the test pad P1. Therefore, the switching element SWAm in the seventh embodiment is not connected to the node N1.

One end of the sub-bit line SBL is connected to the sense unit SUm via the bit line select circuit 10, and the other end thereof is connected to the t-BL select circuit 11. That is, the seventh embodiment is applicable to a so-called single-end semiconductor storage device in which the bit line select circuit 10 and the sense unit SUm (sense amplifier) are located on one side of the memory cell array CA.

Figure 13:
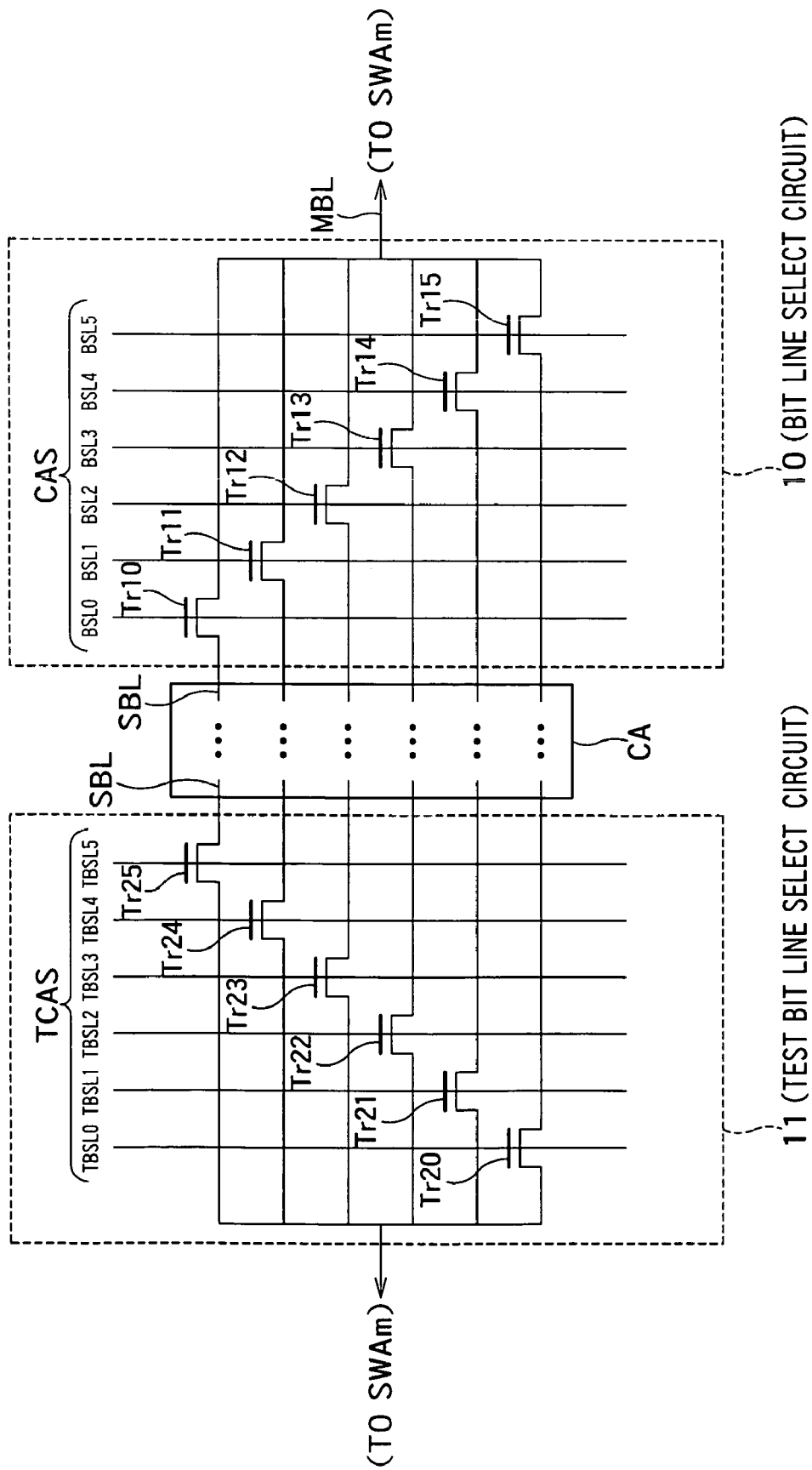
FIG. 13 is a circuit diagram showing configuration of the bit line select circuit 10 and the test bit line select circuit 11.

FIG. 13 is a circuit diagram showing configuration of the bit line select circuit 10 and the test bit line select circuit 11. The bit line select circuit 10 and the test bit line select circuit 11 includes switching elements Tr10~Tr15 and switching elements Tr20~Tr25, respectively, which are individually connected to the respective sub-bit lines SBL.

In the normal write mode and the normal read mode, one of the switching elements Tr10~Tr15 turns on in response to the column select signal CAS. At this time, the t-BL select circuit 11 is not active.

In the test write mode and the test read mode, one of the switching elements Tr20~Tr25 turns on in response to the test column select signal TCAS. At this time, the bit line select circuit 10 is not active.

Note here that only one of the column address signal CAS and the test column address signal TCAS is output, and they are never output simultaneously. Therefore, one column address buffer 30 can process both the column address signal CAS and the test column address signal TCAS in different periods of time.

Next explained are behaviors of the seventh embodiment. The normal write mode and the normal read mode of the seventh embodiment are identical to those of the first embodiment.

(Test Write Mode and Test Read Mode)

In the test write mode and the test read mode, the t-BL select circuit 11 acquires the test column address signal TCAS from the column address buffer 30. The t-BL select circuit 11 selects the sub-bit line SBL of a column according to the test column address signal TCAS, and connects it to the switching element SWAm. The switching element SWAm is on.

Therefore, the seventh embodiment can directly write data into the memory cell MC externally via the test pad P1, or can measure the cell current directly. The seventh embodiment attains the same effects as those of the first embodiment.

(Eighth Embodiment)

Figure 14:
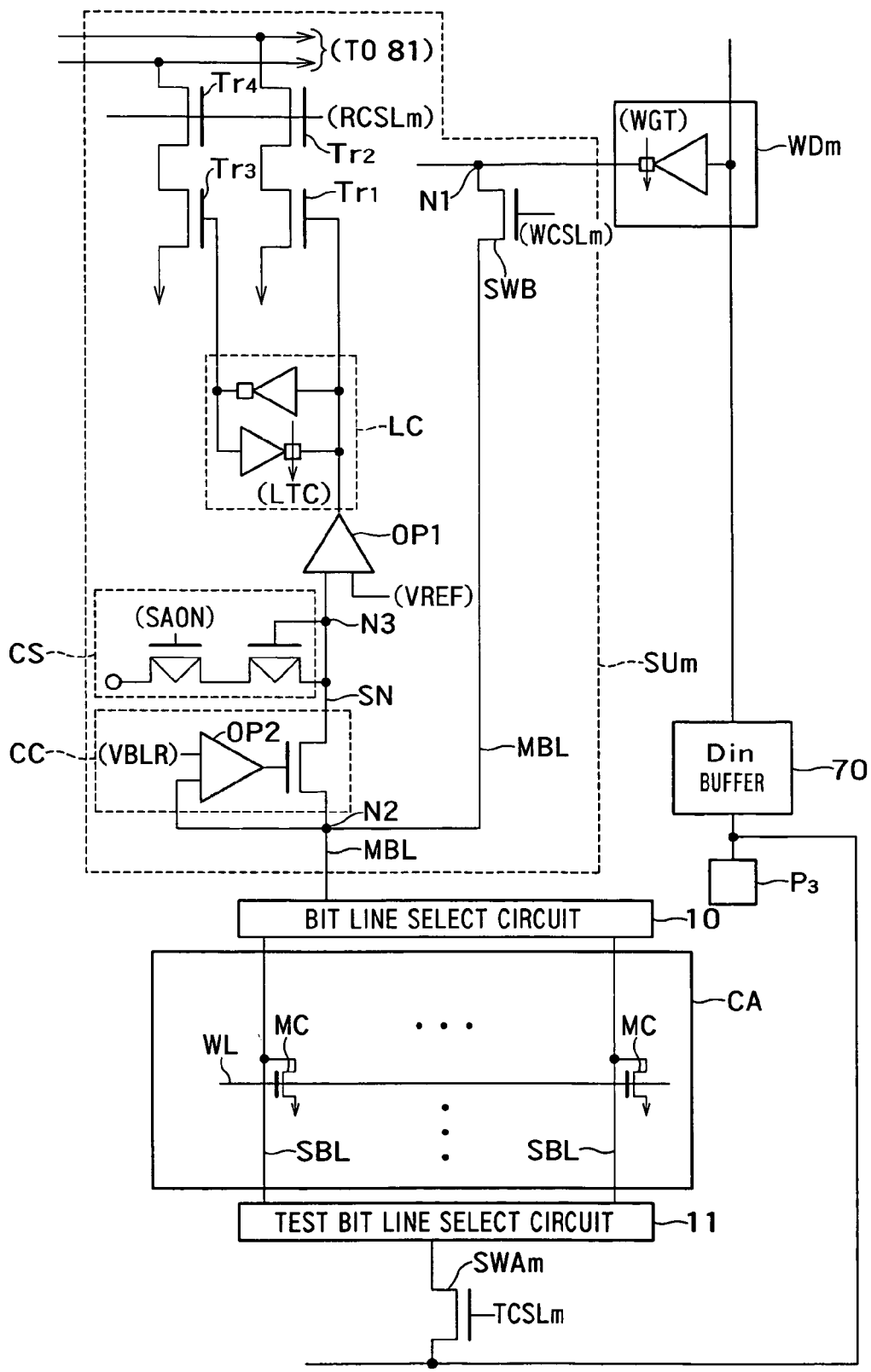
FIG. 14 is a circuit diagram of a semiconductor storage device 800 according to the eighth embodiment of the invention.

FIG. 14 is a circuit diagram of a semiconductor storage device 800 according to the eighth embodiment of the invention. The eighth embodiment is different from the seventh embodiment in commonly using the data input pad P3 as the test pad as well. The other components of the eighth embodiment are identical to those of the seventh embodiment.

In the test write mode and the test read mode, the eighth embodiment applies a voltage externally via the data input pad P3, and measures the cell current via the data input pad P3. The other behaviors of the eighth embodiment, which are not explained here, are identical to those of the seventh embodiment.

The eighth embodiment attains the same effects as those of the seventh embodiment. In addition, since the eighth embodiment uses the existing pad for testing as well, it does not need an additional pad dedicated to testing. As a result, the eighth embodiment restricts the increase of the chip area of the semiconductor storage device.

The invention claimed is:

1. A semiconductor storage device comprising:
   memory cells that store data by accumulating or releasing an electric charge;
   a memory cell array having a matrix arrangement of the memory cells;
   a plurality of word lines connected to memory cells aligned on rows of the memory cell array;
   a plurality of sub-bit lines connected to memory cells aligned on columns of the memory cell array;
   a bit line select circuit selecting the sub-bit line of a column;
   a main bit line connected to the sub-bit line selected by the bit line select circuit;
   a sense line detecting the potential of the sub-bit line selected by the bit line select circuit via the main bit line and reading data out of the memory cell;
   a write driver applying a voltage to the sub-bit line selected by the bit line select circuit via the main bit line and writing data into the memory cell; and
   a first switching element connected to the main bit line and turning on when the current flowing in the memory cell is detected externally via the sub-bit line without the use of the sense line or when a voltage is applied to the memory cell externally via the sub-bit line without the use of the write driver.

2. The semiconductor storage device according to claim 1 further comprising:
   a test pad connected to the main bit line by turning the first switching element on,
   wherein the first switching element is connected between the test pad and an output of the write driver.

3. The semiconductor storage device according to claim 1 further comprising:
   an input pad used when the write driver applies a voltage to the sub-bit line,
   wherein the first switching element is connected between the input pad and an output of the write driver.

4. The semiconductor storage device according to claim 1 further comprising:
   an input pad used when the write driver applies a voltage to the sub-bit line,
   wherein the first switching element is connected in parallel to the write driver.

5. The semiconductor storage device according to claim 1 further comprising:
   a clamp circuit including an end connected to the main bit line and applying a constant voltage to the memory cell during the process of reading data in the memory cell;
   an operational amplifier connected to the other end of the clamp circuit and comparing a first voltage with a reference voltage, the first voltage depending on a current which flows in the memory cell during the process of reading data in the memory cell;
   a second switching element interposed in the main bit line from the write drive to the bit line select circuit; and
   a third switching element having one end connected between the clamp circuit and the operational amplifier and the other end connected to the main bit line from the driver to the second switching element.

6. The semiconductor storage device according to claim 1, wherein
   the first switching element is a MOSFET.

7. The semiconductor storage device according to claim 2 further comprising:
   a clamp circuit including an end connected to the main bit line and applying a constant voltage to the memory cell during the process of reading data in the memory cell;
   an operational amplifier connected to the other end of the clamp circuit and comparing a first voltage with a reference voltage, the first voltage depending on a current which flows in the memory cell during the process of reading data in the memory cell;
   a second switching element interposed in the main bit line from the write drive to the bit line select circuit; and
   a third switching element having one end connected between the clamp circuit and the operational amplifier and the other end connected to the main bit line from the driver to the second switching element.

8. The semiconductor storage device according to claim 3 further comprising:
   a clamp circuit including an end connected to the main bit line and applying a constant voltage to the memory cell during the process of reading data in the memory cell;
   an operational amplifier connected to the other end of the clamp circuit and comparing a first voltage with a reference voltage, the first voltage depending on a current which flows in the memory cell during the process of reading data in the memory cell;
   a second switching element interposed in the main bit line from the write drive to the bit line select circuit; and
   a third switching element having one end connected between the clamp circuit and the operational amplifier and the other end connected to the main bit line from the driver to the second switching element.

9. The semiconductor storage device according to claim 5, wherein
   the first to third switching element are MOSFETs.

10. The semiconductor storage device according to claim 4 further comprising:
    a bypass switching element connected in parallel to a buffer intervening between the input pad and the input of the write driver.

11. The semiconductor storage device according to claim 4 further comprising:
    a clamp circuit including an end connected to the main bit line and applying a constant voltage to the memory cell during the process of reading data in the memory cell;
    an operational amplifier connected to the other end of the clamp circuit and comparing a first voltage with a reference voltage, the first voltage depending on a current which flows in the memory cell during the process of reading data in the memory cell;
    a second switching element interposed in the main bit line from the write drive to the bit line select circuit; and
    a third switching element having one end connected between the clamp circuit and the operational amplifier and the other end connected to the main bit line from the driver to the second switching element.

12. The semiconductor storage device according to claim 10 further comprising:
- a clamp circuit including an end connected to the main bit line and applying a constant voltage to the memory cell during the process of reading data in the memory cell;
- an operational amplifier connected to the other end of the clamp circuit and comparing a first voltage with a reference voltage, the first voltage depending on a current which flows in the memory cell during the process of reading data in the memory cell;
- a second switching element interposed in the main bit line from the write drive to the bit line select circuit; and
- a third switching element having one end connected between the clamp circuit and the operational amplifier and the other end connected to the main bit line from the driver to the second switching element.

13. The semiconductor storage device according to claim 10, wherein
the bypass switching element is a MOSFET.

14. A semiconductor storage device comprising:
memory cells that store data by accumulating or releasing an electric charge;
a memory cell array having a matrix arrangement of the memory cells;
a plurality of word lines connected to memory cells aligned on rows of the memory cell array;
a plurality of sub-bit lines connected to memory cells aligned on columns of the memory cell array;
a first bit line select circuit selecting the sub-bit line of a column of the memory cell array during a normal operation of the semiconductor storage device;
a main bit line connected to the sub-bit line selected by the first bit line select circuit;
a sense line detecting the potential of the sub-bit line selected by the first bit line select circuit via the main bit line and reading data out of the memory cell;
a write driver applying a voltage to the sub-bit line selected by the first bit line select circuit via the main bit line and writing data into the memory cell;
a second bit line select circuit selecting the sub-bit line of a column of the memory cell array during a test operation of the semiconductor storage device; and
a first switching element connected to the second bit line select circuit and turning on when the potential of the sub-bit line is detected externally without the use of the sense line or when a voltage is applied to the sub-bit line externally without the use of the write driver.

15. The semiconductor storage device according to claim 14 further comprising:
a test pad connected to the second bit line select circuit by turning the first switching element on,
wherein the first switching element is connected between the test pad and the second bit line select circuit.

16. The semiconductor storage device according to claim 14 further comprising:
an input pad used when the write driver applies a voltage to the sub-bit line,
wherein the first switching element is connected between the input pad and the second bit line select circuit.

17. The semiconductor storage device according to claim 14 further comprising:
an input pad used when the write driver applies a voltage to the sub-bit line,
wherein the first switching element is connected between an input of the write driver and the second bit line select circuit.

18. The semiconductor storage device according to claim 14, wherein
the first switching element is a MOSFET.

19. The semiconductor storage device according to claim 17 further comprising:
a bypass switching element connected in parallel to a buffer intervening between the input pad and the input of the write driver.

20. The semiconductor storage device according to claim 19, wherein
the bypass switching element is a MOSFET.

* * * * *